United States Patent [19]

Smith

[11] 4,315,152
[45] Feb. 9, 1982

[54] ELECTRON BEAM APPARATUS

[75] Inventor: Kenneth C. A. Smith, Cambridge, England

[73] Assignee: National Research Development Corporation, London, England

[21] Appl. No.: 81,554

[22] Filed: Oct. 3, 1979

Related U.S. Application Data

[63] Continuation of Ser. No. 888,991, Mar. 22, 1978, abandoned.

[30] Foreign Application Priority Data

Mar. 23, 1977 [GB] United Kingdom ............... 12175/77

[51] Int. Cl.³ .............................................. H01J 37/00
[52] U.S. Cl. .............................. 250/396 ML; 250/398
[58] Field of Search ........... 250/396 R, 396 ML, 397, 250/398, 423 R, 311, 310; 219/121 EB, 121 FM; 313/361, 442, 433

[56] References Cited

U.S. PATENT DOCUMENTS 3,707,628 12/1972 Bassett et al. ............... 250/396 ML
3,812,365 5/1974 LePoole ...................... 250/396 ML
3,870,891 3/1975 Mulvey ....................... 250/396 ML
3,924,126 12/1975 Anderson et al. .............. 250/396 R

FOREIGN PATENT DOCUMENTS 603939 of 1948 United Kingdom .
1291221 10/1972 United Kingdom .

Primary Examiner—Bruce C. Anderson
Attorney, Agent, or Firm—Cushman, Darby & Cushman

[57] ABSTRACT

In an electron-beam probe instrument such as a scanning electron microscope in which the electron gun employs a field-emission cathode the condenser lens is of the 'snorkel' design. The term 'snorkel' is used to denote a single-pole magnetic lens in which the polepiece has an axially extending nose portion. The lens is positioned so that the cathode region is immersed in the radial field at the nose of the lens. Preferably the lens is placed closely behind the cathode but outside the vacuum envelope.

12 Claims, 7 Drawing Figures

ELECTRON BEAM APPARATUS

This is a continuation, of application Ser. No. 888,991 filed Mar. 22, 1978 now abandoned.

The invention relates to electron beam apparatus particularly in relation to high-resolution electron beam probe instruments such as the scanning electron microscope (SEM) and focusing arrangements therefor.

The SEM and similar instruments generally include a form of conventional magnetic lens which depends on the presence of a non-uniform axially symmetric field in a short axial gap between two pole-pieces. The aberrations inherent in such an arrangement can be reduced to a tolerable level by stopping down the beam at limiting apertures and this procedure is acceptable for an electron source of relatively large area such as a thermionic filament. For a very small source, however, a serious loss of brightness results from enlargement of the projected image caused by lens aberrations.

According to the invention an electron beam apparatus comprises a vacuum envelope, an electron gun including a cathode of small emitting area for producing an electron beam along a predetermined axis, and single-pole magnetic lens means including a pole-piece having an axially extending nose portion directed towards the emitting area, the lens means being effective in use to cause the axial region adjacent the emitting area to be immersed in an axially symmetric magnetic field such that the beam is focused at a desired position on the axis.

The magnetic lens is of the kind which is referred to in the literature as the 'snorkel' lens which produces in the region of the nose a substantially radial field.

The lens may be disposed in front of the emitting area, the pole-piece having an axial passage for the transmission of the beam. Alternatively, the lens may be disposed behind the emitting area, and further, may be disposed externally of the vacuum envelope.

In the form of apparatus in which the lens is behind the emitting area the nose portion of the pole-piece may have an axial passage to enable the nose portion to be advanced to at least partially enclose the cathode.

The nose portion of the lens means may then be arranged for external connection to a source of potential which is variable with respect to the cathode whereby the emission current may be controlled.

The lens may be energised by means of a permanent magnet, or by a current-carrying coil.

Preferably the cathode is of the field emission type. Alternatively, the cathode may be photo-emissive, for example comprising a layer of photo-emissive material deposited on one face of a transparent substrate, the apparatus further including means for directing illumination on to the other face of the substrate. The means for directing illumination may be a light pipe.

The apparatus may further include means for mounting a specimen on the axis close to the end wall of the envelope remote from the cathode and single-pole lens means disposed external to the end wall so that the beam is refocused in the plane of the specimen from the desired position on the axis.

The so-called 'snorkel' lens is a recently developed form of lens particularly directed to use as the objective lens of the scanning electron microscope. The conventional lens comprises two parallel pole-pieces having axial holes to transmit the electron beam, the magnetic field distribution between the poles being distorted by the presence of the holes so that a focusing action results. In order to maintain a high value of axial flux and consequently reduced lens aberration the holes and the gap between poles must be made very small. With an objective lens of such design the handling of the specimen and the collection of secondary electrons and X-rays therefore become difficult. The 'snorkel' is a single-pole lens providing a radial field from a generally conical nose which extends from the pole-face. Particularly when such a lens is placed outside the vacuum chamber, but so close to the specimen that the final focus can be precisely controlled, the problems of access to the specimen and the collection of particles are largely solved.

It has not previously been appreciated that the 'snorkel' lens can usefully provide the first focusing field at the cathode. The invention lies in the appreciation of this possibility and the particular advantages to be derived for cathodes of small emitting area such as the field emission cathode. The problem in this context is that of loss of beam intensity caused by lens aberrations. In order to reduce aberrations the lens must be operated with short focal length, the object being immersed in the field of the lens. It has already been pointed out that the permissible dimensions of gaps in a conventional lens are very small and they prove to be incompatible with the voltages which must be applied to the field emission gun. Such difficulties can be avoided, largely by the use of a single pole lens.

Exemplary embodiments of the invention will now be described with reference to the accompanying drawings in which.

Figure 1:
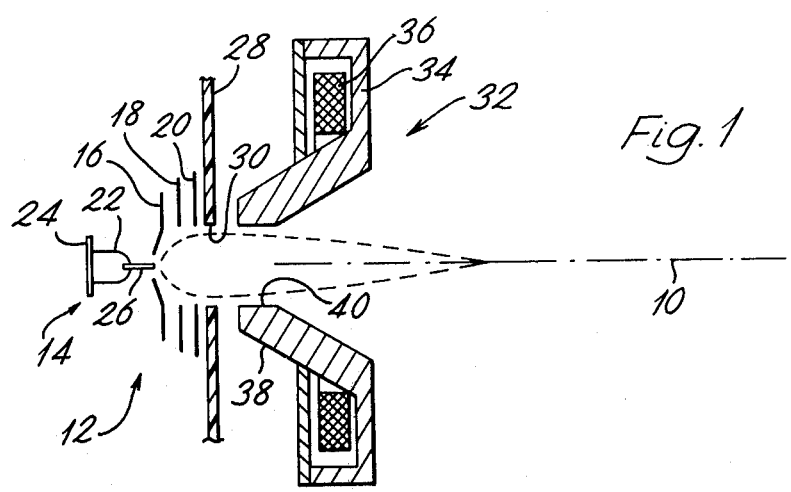
FIG. 1 represents diagrammatically the electron gun of a device having a magnetic lens in accordance with the invention.

With reference to FIG. 1 a chain-line 10 represents the optical axis of a system on which a beam from an electron gun 12 is to be brought to a focus. The gun 12 is of tetrode construction and comprises a field-emission cathode assembly 14, a beam control electrode 16, a first anode 18 and a second anode 20. The cathode assembly 14 is made up from a tungsten wire support 22 on a base 24, the cathode 26 being a short length of single crystal tungsten welded to support 22. The crystal is aligned with the axis 10 so that on exposure to an electric field of a few kV/mm field emission occurs in the axial direction from the end face of the crystal. Ultra-high vacuum conditions are essential for stability of field emission whilst the remaining sections of the electron-optical column can be operated at a slightly higher pressure. The electron gun 12 is therefore partly isolated for pumping purposes by a non-magnetic wall 28 having an axial aperture 30. A snorkel lens assembly 32 is mounted with axial symmetry close to the wall 28 on the side remote from gun 12. The assembly 32 comprises a cylindrical pole piece 34 with an energising coil 36 and the 'snorkel' feature of a pole piece nose 38 extending axially from pole piece 34 and tapering in diameter towards the wall 28. The nose 38 has an axial aperture 40. Conventional demountable vacuum sealing means (not shown) can readily be adapted for mounting the lens 32 in the vacuum envelope without exposing the coil 36 to high vacuum.

In operation the emission current from cathode 26 is controlled by electrode 16 and accelerated between anodes 18 and 20. Anode 20 is held at earth potential and cathode 26 is therefore at a negative potential the value of which depends (in a microscope) on the nature of the specimen to be exposed to the beam. For smaller potentials pole piece 38 can be brought close to cathode 26 to allow operation with short focal length to give the least aberration. For larger potentials the working spacing must be increased with a reduced advantage in focus quality. In all cases the field due to pole piece 38 extends in some degree to cathode 26 so that emergent electrons are immediately subject to the influence of the field. The computation of electron trajectories is complicated by the simultaneous acceleration in the electrostatic field and deflection in the magnetic field but the performance can be predicted.

In discussing alternative focusing arrangements only the basic elements of the gun and lens need be illustrated. Thus in FIG. 2 pole-piece 38 is mounted behind cathode assembly 14 and axial aperture 40 is of sufficient size to slide over cathode assembly 14. The beam emergent from the cathode 26 is immersed in the magnetic field at or near its peak value. Additionally the nose 38 may be operated at a variable potential with respect to cathode 26 and thereby serve as the emission control electrode. If the potential is high with respect to earth it may be inconvenient to energise the lens by means of a current-carrying coil. As an alternative a permanent magnet can be used in the manner indicated later in the specification.

Figure 2:
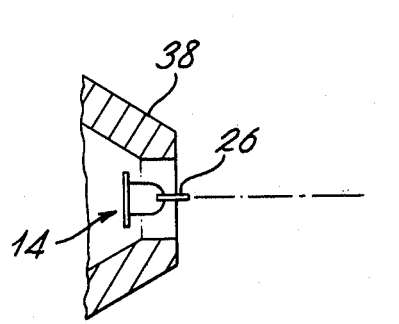
FIG. 2 represents diagrammatically the electron gun of FIG. 1 with an alternative disposition of the magnetic lens.
Figure 3:
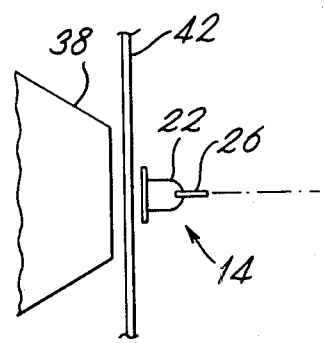
FIG. 3 represents diagrammatically the electron gun of FIG. 1 with a further alternative disposition of the magnetic lens.

FIG. 3 illustrates a further possible disposition of the lens which is considered to have several advantages. Cathode assembly 14 is now mounted close to a non-magnetic wall 42 of the vacuum enclosure, with a possible further reduction in axial length by arranging cathode mount 22 in a plane parallel to wall 42 instead of in the axial plane shown. Pole piece nose 38 is now mounted outside the wall 42 so that construction is simplified and the aperture 40 is not required. The arrangement is similar to that of FIG. 2 in that the electron beam is emitted in a direction away from the face of the pole 38 (instead of towards it as in FIG. 1) and this relationship is particularly favourable to a reduction in spherical aberration.

Figure 4:
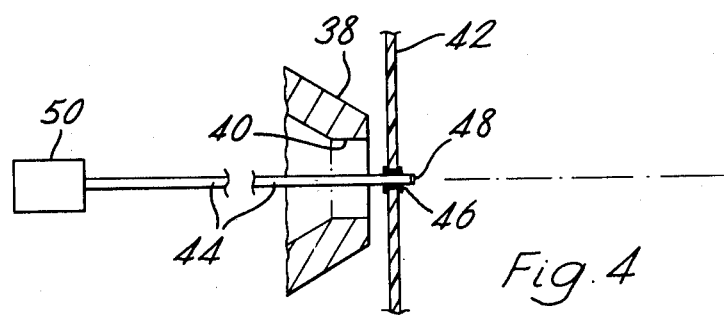
FIG. 4 represents diagrammatically an alternative electron gun with a magnetic lens disposed as in FIG. 3.

FIG. 4 illustrates a use of the single pole lens in a manner similar to that of FIG. 3 but with an alternative form of cathode. The lens is represented by the nose 38 as before with an axial aperture 40 sufficient to allow free passage for an optical fibre or light-pipe 44. The fibre 44 is passed through a seal 46 in the wall 42 of the vacuum chamber and terminates at a small distance inside the chamber. The planar end face of the fibre 44 within the chamber is coated with a layer 48 of photo-emissive material and the remote end of fibre 44 is coupled to an intense source of light 50, which corresponds spectrally to the region of maximum sensitivity of the layer 48. A photo-emissive cathode excited in this way provides advantages in freedom of choice in the size of the emitting area and also freedom from any need for high values of electric field for extraction. The desired accelerating potential can therefore be applied by means of any preferred electrode arrangement. The position of pole 38 is again favourable to undistorted focusing.

Figure 5:
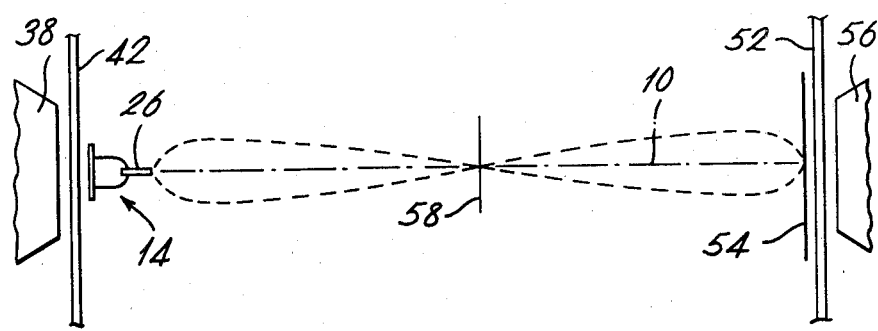
FIG. 5 represents diagrammatically an electron beam probe instrument incorporating the invention.

FIG. 5 shows in outline the construction of a probe instrument embodying a condenser lens following the example of FIG. 3. The instrument has a vacuum chamber bounded by end walls 42, 52 and has an optical axis 10. A field emission gun of which only the cathode assembly 14 is shown is mounted on the inner face of wall 42 and a specimen mounting stage 54 is arranged close to the inner face of wall 52. A single pole lens indicated by the pole 38 is arranged on axis 10 close to the outer face of wall 42 and a similar lens indicated by a pole 56 on axis 10 at the outer face of wall 52. In operation pole 38 is effective as a condenser lens to produce in a plane 58 on axis 10 an enlarged image of the effective source at cathode 26. In turn this image is demagnified by the objective lens field of pole 56 to a focus on the specimen at stage 54 near to the focal plane of pole 56. The use of the single-pole lens in the objective mode is already known but the outline of FIG. 5 shows that a two-lens system can be made in which both lenses are operated under the most favourable conditions relating beam direction and field geometry. Both lenses are also open to the atmosphere so that constraints on the construction of the vacuum chamber are avoided.

Figure 6A:
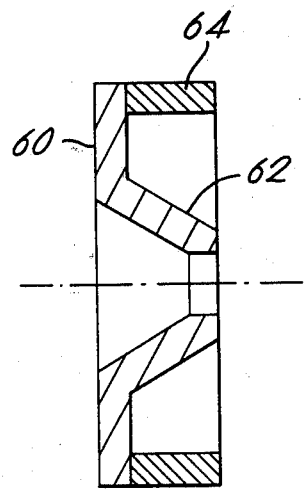
FIGS. 6a and 6b represent diagrammatically alternative constructions of permanent magnet lens.
Figure 6B:
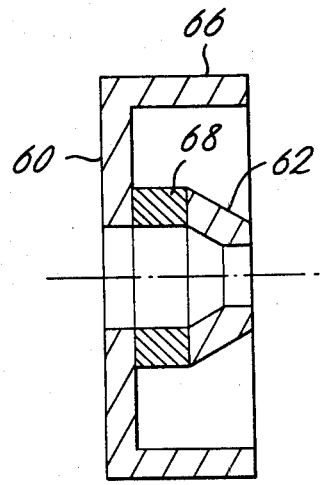

It will be apparent that, as was indicated with reference to FIG. 2, the single pole lens is preferably energised by a permanent magnet in particular circumstances. FIGS. 6(a) and 6(b) indicate alternative structures. In FIG. 6(a) a circular iron pole face plate 60 carries an axi-symmetric conical extension or nose 62 which is energised by a cylindrical permanent magnet 64 extending over the nose 62 from the periphery of the plate 60. In FIG. 6(b) the cross-section of the pole members is unchanged but the outer cylindrical portion 66 is now of iron and a cylindrical permanent magnet 68 is inserted in the nose portion.

Specific arrangements of cathode and condenser lens have been described with reference to the Figures to illustrate the advantages of the single-pole lens for use with cathodes of small emitting area. In general however, either the 'front of cathode' or 'behind cathode' pole positions can be used with any suitable cathode; in the latter case the pole may be inside or outside the wall of the vacuum chamber; and the lens may be energised by a winding or by permanent magnet.

I claim:
1. Electron beam apparatus comprising:
vacuum enclosure means for the electron beam;
an electron gun including cathode means of small emitting area for producing an electron beam along a predetermined axis; and
single pole magnetic lens means including a pole-piece having a generally conical nose portion which extends from the pole-piece along said axis towards said emitting area,
said lens means being so disposed as to cause said emitting area to be exposed to an axially symmetric magnetic field extending from said nose and operative on said beam immediately on emergence from said emitting area, such that said beam is focused at a desired position on said axis, the cathode and the nose of the pole-piece being disposed on the same side of the radial plane containing the desired position.

2. Apparatus according to claim 1 wherein said lens means is disposed in front of said emitting area, said pole-piece having an axial passage for the transmission of said beam.

3. Apparatus according to claim 1 wherein said lens means is disposed behind said emitting area.

4. Apparatus according to claim 3 wherein said nose portion of said pole-piece has an axial passage to enable said nose portion to be advanced to at least partially enclose said cathode means.

5. Apparatus according to claim 4 wherein said pole-piece has means for external connection to a source of potential which is variable with respect to said cathode to enable the emission from said cathode to be controlled.

6. Apparatus according to claim 3 wherein said lens means is disposed externally of said vacuum enclosure means.

7. Apparatus according to claim 1 wherein said lens means is energised in use by means of a coil arranged for connection to a current source.

8. Apparatus according to claim 1 wherein said lens means is energised by means of a portion of said pole-piece comprising a permanent magnet.

9. Apparatus according to claim 1 wherein said cathode means is arranged for field emission.

10. Apparatus according to claim 1 wherein said cathode means comprises a layer of photo-emissive material deposited on one face of a transparent substrate, said apparatus including further means for directing illumination on to the other face of the substrate.

11. Apparatus according to claim 10 wherein said means for directing illumination comprises light-pipe means having means at one end for coupling to a light source and terminating at the other end in said other face.

12. Apparatus according to claim 1 further including means for mounting a specimen on said axis close to an end wall of said vacuum enclosure means remote from said cathode, and single-pole lens means disposed externally of said end wall effective to cause said beam to be refocused in the plane of said specimen from said desired position on said axis.

* * * * *